(12) United States Patent
Omori

(10) Patent No.: US 10,439,619 B2
(45) Date of Patent: Oct. 8, 2019

(54) RECORDING APPARATUS, CONTROL METHOD, AND STORAGE MEDIUM

(71) Applicant: CANON KABUSHIKI KAISHA, Tokyo (JP)

(72) Inventor: Noboru Omori, Yokohama (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 15/926,437

(22) Filed: Mar. 20, 2018

(65) Prior Publication Data
US 2018/0278257 A1 Sep. 27, 2018

(30) Foreign Application Priority Data

Mar. 24, 2017 (JP) ................. 2017-059692

(51) Int. Cl.
| | |
|---|---|
| *G06F 12/00* | (2006.01) |
| *G06F 13/00* | (2006.01) |
| *H03L 7/08* | (2006.01) |
| *G06F 13/38* | (2006.01) |
| *H03L 7/081* | (2006.01) |
| *H04L 7/04* | (2006.01) |
| *H04L 7/033* | (2006.01) |

(Continued)

(52) U.S. Cl.
CPC .......... *H03L 7/0807* (2013.01); *G06F 13/385* (2013.01); *G11B 7/00456* (2013.01); *G11B 20/10527* (2013.01); *H03L 7/0814* (2013.01); *H03L 7/091* (2013.01); *H04L 7/0331* (2013.01); *H04L 7/048* (2013.01); *G06F 2213/3804* (2013.01); *G11B 2020/1062* (2013.01); *G11B 2020/10675* (2013.01)

(58) Field of Classification Search
CPC ............... G06F 13/1389; G06F 3/0659; G06F 2213/3804; G11C 7/22; G11C 7/1072
See application file for complete search history.

(56) References Cited

U.S. PATENT DOCUMENTS

| 9,288,429 B2 | 3/2016 | Omori | |
|---|---|---|---|
| 2007/0152723 A1* | 7/2007 | Ahn | G11C 7/22 327/158 |

(Continued)

FOREIGN PATENT DOCUMENTS

JP 2012-054715 A 3/2012

*Primary Examiner* — Sean D Rossiter
(74) *Attorney, Agent, or Firm* — Carter, DeLuca & Farrell LLP

(57) ABSTRACT

A recording apparatus is provided. An adjustment unit executes adjustment processing for adjusting a delay amount of a timing signal. An input control unit executes input control to input continuously recording target data to be recorded to a storage medium, to a buffer memory. A recording control unit executes recording control for recording the recording target data held in the buffer memory to the storage medium, using an input/output unit configured to receive data from the storage medium according to the timing signal. A control unit performs control such that the input control is started before a recording start instruction and the recording control is started in response to the recording start instruction, and such that the adjustment processing is executed during execution of the input control and before the recording control is started in response to the recording start instruction.

12 Claims, 6 Drawing Sheets

(51) Int. Cl.
*G11B 7/0045* (2006.01)
*H03L 7/091* (2006.01)
*G11B 20/10* (2006.01)

(56) References Cited

U.S. PATENT DOCUMENTS

| | | | |
|---|---|---|---|
| 2009/0154256 A1* | 6/2009 | Kim | G11C 7/1051 |
| | | | 365/189.05 |
| 2016/0182063 A1* | 6/2016 | Seo | H03L 7/0812 |
| | | | 327/149 |
| 2016/0284385 A1* | 9/2016 | Nomura | G06F 1/3284 |
| 2018/0276152 A1 | 9/2018 | Omori | |
| 2018/0284998 A1* | 10/2018 | Omori | G06F 3/0679 |

* cited by examiner

RECORDING APPARATUS, CONTROL METHOD, AND STORAGE MEDIUM

BACKGROUND OF THE INVENTION

Field of the Invention

The present invention relates to a recording apparatus, a control method, and a storage medium.

Description of the Related Art

Conventionally, there are apparatuses for writing image data, audio data and the like to a storage medium such as a memory card and the like, and reading out and reproduce data recorded in the storage medium. Reading/writing of data between an apparatus (host apparatus) to which the storage medium is connected and the storage medium is performed in accordance with clock signals generated in the host apparatus. After host apparatus transmits a clock pulse of a clock signal, transmission/reception of the data to be written or read-out, or reception of a response corresponding to a command is performed. For this reason, the clock pulse is not transmitted/received at a timing completely synchronized with the transmission/reception of the data and the response. For example, when the host apparatus performs reading-out of the data from a storage medium such as an SD memory card, a delay of a standardized fixed value exists after the clock pulse is given from the host apparatus to the storage medium and until data transmission is performed. For this reason, the host apparatus acquires the data transmitted from the storage medium by latching the data transmitted from the storage medium at a timing delayed by the fixed value after transmission of the clock pulse.

On the other hand, in recent years, due to improvement of data rate for reading/writing to such a storage medium, acceleration of the clock pulse frequency has been necessary, which has made it difficult for the delay amount from the clock pulse for acquiring the data to be defined by a fixed value. In view of this, UHS-I (Ultra High Speed I), a high speed standard of SD cards, defines that reading-out of data should be performed after adjusting a data latch timing for each card when performing reading-out of data using a high-speed clock. Such adjustment work for latch timing is called tuning (e.g. see Japanese Patent Laid-Open No. 2012-54715).

Also, in recent years, image capturing apparatuses have been proposed that have a function of storing captured moving images in a buffer memory in a recording standby state, and when a recording start instruction is given, recording the moving image data that is stored in the buffer memory and corresponds to a certain period just before the start of recording, to a storage medium. This function is called "pre-recording".

When pre-recording is performed, since moving image data is repeatedly input to the buffer memory in the recording standby state, available capacity in the buffer memory decreases. Then, when a recording start instruction is given, recording to the storage medium is performed at a speed higher than that of inputting moving image data to the buffer memory, and thus the available capacity in the buffer memory gradually increases. However, if a write error or a retry occurs due to lack of tuning at a timing just after the start of recording, the moving image data cannot be written to the storage medium, and there is a possibility that the buffer memory will overflow.

SUMMARY OF THE INVENTION

The present invention has been made in view of the above circumstances and provides a technique for reducing the likelihood that a buffer overflow will occur after the start of recording in a case where inputting of recording target data to the buffer memory starts before a recording start instruction is given.

According to a first aspect of the present invention, there is provided a recording apparatus comprising: an output unit configured to output a clock signal to a storage medium; an input/output unit configured to output a write command and data to be written to the storage medium according to the clock signal in order to write data to the storage medium, and configured to receive data from the storage medium according to a timing signal; a generation unit configured to generate the timing signal by delaying the clock signal; an adjustment unit configured to execute adjustment processing for adjusting a delay amount of the timing signal; a buffer memory configured to hold input data; an input control unit configured to execute input control to input continuously recording target data to be recorded to the storage medium, to the buffer memory; a recording control unit configured to execute recording control for recording the recording target data held in the buffer memory to the storage medium, using the input/output unit; and a control unit configured to control the input control unit, the recording control unit, and the adjustment unit, wherein the control unit: performs control such that the input control is started before a recording start instruction and the recording control is started in response to the recording start instruction; and performs control such that the adjustment processing is executed during execution of the input control and before the recording control is started in response to the recording start instruction.

According to a second aspect of the present invention, there is provided a control method executed by a recording apparatus comprising: an output unit configured to output a clock signal to a storage medium; an input/output unit configured to output a write command and data to be written to the storage medium according to the clock signal in order to write data to the storage medium, and configured to receive data from the storage medium according to a timing signal; a generation unit configured to generate the timing signal by delaying the clock signal; and a buffer memory configured to hold input data, the control method comprising: executing adjustment processing for adjusting a delay amount of the timing signal; executing input control to input continuously recording target data to be recorded to the storage medium, to the buffer memory; executing recording control for recording the recording target data held in the buffer memory to the storage medium, using the input/output unit; performing control such that the input control is started before a recording start instruction and the recording control is started in response to the recording start instruction; and performing control such that the adjustment processing is executed during execution of the input control and before the recording control is started in response to the recording start instruction.

According to a third aspect of the present invention, there is provided a non-transitory computer-readable storage medium which stores a program for causing a computer of a recording apparatus to execute a control method, the recording apparatus comprising: an output unit configured to output a clock signal to a storage medium; an input/output unit configured to output a write command and data to be written to the storage medium according to the clock signal in order to write data to the storage medium, and configured to receive data from the storage medium according to a timing signal; a generation unit configured to generate the timing signal by delaying the clock signal; and a buffer memory configured to hold input data, the control method comprising: executing adjustment processing for adjusting a delay amount of the timing signal; executing input control to input continuously recording target data to be recorded to the storage medium, to the buffer memory; executing recording control for recording the recording target data held in the buffer memory to the storage medium, using the input/output unit; performing control such that the input control is started before a recording start instruction and the recording control is started in response to the recording start instruction; and performing control such that the adjustment processing is executed during execution of the input control and before the recording control is started in response to the recording start instruction.

Further features of the present invention will become apparent from the following description of exemplary embodiments (with reference to the attached drawings).

DESCRIPTION OF THE EMBODIMENTS

Hereinafter, embodiments of the present invention will be described with reference to the attached drawings. It should be noted that the technical scope of the present invention is defined by the claims, and is not limited by the following respective embodiments. Also, not all of the combinations of the aspects that are described in the embodiments are necessarily essential to the present invention. Also, the aspects that are described in the respective embodiments can be combined as appropriate.

First Embodiment

Figure 1:
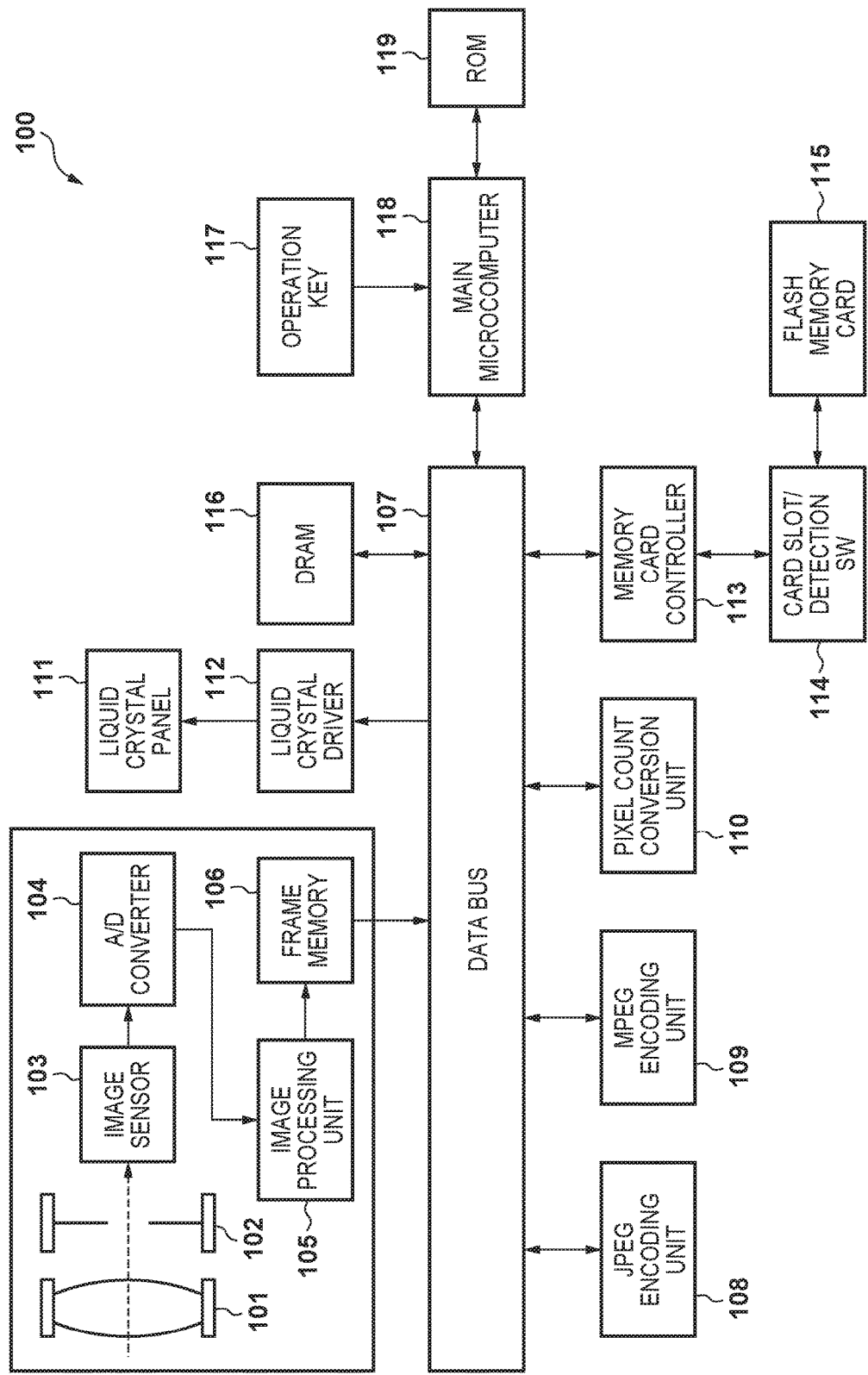
FIG. 1 is a block diagram showing a configuration example of a digital camera 100.

An embodiment will be described in which a recording apparatus of the present invention is applied to an image capturing apparatus such as a digital camera. FIG. 1 is a block diagram showing a configuration example of a digital camera 100 according to a first embodiment. In FIG. 1, a photographic lens 101 captures a subject image, and forms the subject image on an image sensor 103 after a light amount is limited to a predetermined amount by a diaphragm 102. The formed subject image is digitized by an A/D converter 104. After an image processing unit 105 performs gamma compensation, white balance compensation, noise reduction, and the like, the digitized image data is output to a data bus 107 as uncompressed image data.

A JPEG encoding unit 108 performs compression-encoding on the uncompressed image data to a still image, and generates JPEG still image data. An MPEG encoding unit 109 performs compression-encoding on the uncompressed image data to a moving image, and generates MPEG moving image data.

A liquid crystal panel 111 is a display unit that displays images and various kinds of information. A liquid crystal driver 112 converts data for image display stored in the DRAM 116 to liquid crystal display signals, and supplies the signals to the liquid crystal panel 111. In this way, the image data to be displayed that was written to the DRAM 116 is displayed by the liquid crystal panel 111 via the liquid crystal driver 112. The liquid crystal panel 111 can also function as an electronic viewfinder and perform through-image display. When the liquid crystal panel 111 is caused to function as the electronic viewfinder, the liquid crystal driver 112 reduces the resolution of digital signals that were once A/D converted by the A/D converter 104 and accumulated in the DRAM 116, according to dot count of the liquid crystal panel 111. After that, the liquid crystal driver 112 converts the digital signals to liquid crystal display signals, and sequentially transfers the liquid display signals to the liquid crystal panel 111.

The DRAM 116 is used also as a buffer memory for temporarily storing data to be recorded in a flash memory card 115, such as JPEG still image data generated in the JPEG encoding unit 108 or MPEG moving image data generated in the MPEG encoding unit 109. In addition, as described later, if pre-recording is activated, the encoded moving image data is sequentially (continuously) input to and stored in the buffer memory in the DRAM 116 in the recording standby state. The moving image data stored in the buffer memory is managed in units of GOPs of the MPEG moving image data. If the data amount of moving image data stored in the buffer memory in the recording standby state exceeds a threshold value, the moving image data is discarded in units of GOPs from the buffer memory. The data stored in the buffer memory space in the DRAM 116 is read out by the memory card controller 113 and written to the flash memory card 115 (storage medium). Writing/reading of data to/from the buffer memory space is controlled by the main microcomputer 118. In addition, the DRAM 116 also provides a working memory space for a pixel count conversion unit 110 that generates thumbnail images to be used for an index display during reproduction, from the captured images. Furthermore, as described above, the DRAM 116 also provides a space serving as a video memory for performing display on the liquid crystal panel 111.

The flash memory card 115 is a memory card that is attachable/detachable to/from the digital camera 100 via a card slot/detection SW 114, constituted by, for example, NAND type flash memory. The main microcomputer 118 manages data recorded in the flash memory card 115 as a file according to a predetermined file system such as a FAT (File Allocation Table) file system.

The memory card controller 113 controls the flash memory card 115 and records data from the DRAM 116 to the flash memory card 115. Also, the memory card controller 113 reads out data from the flash memory card 115 and performs data transfer to the DRAM 116. The card slot/detection SW 114 is a slot in which the flash memory card 115 is mounted, and includes a detection SW (switch) for detecting whether or not the flash memory card 115 is mounted in the slot.

Operation keys 117 are various kinds of switches that receive various operations from a user, and include a shutter button for performing an operation of capturing still images, a trigger button for instructing the start and stop of moving image capture, and a mode switch for switching between a camera capturing mode and a reproduction mode.

The ROM 119 is a non-volatile memory that is capable of electrically deleting/recording, and that stores constants, programs, and the like for operation of the main microcomputer 118. The program mentioned here is a program for executing various later-described sequences in the present embodiment, and realizes the later-described operations of the present embodiment.

The main microcomputer 118 has a CPU and operates according to the operation programs stored in the ROM 119, and controls the units of the digital camera 100. The main microcomputer 118 performs display control by controlling the liquid crystal driver 112 and the like. Also, in the present embodiment, the main microcomputer 118 utilizes tuning pattern signals with the same pattern as that stored in the flash memory card 115, and performs later-described judgement of whether or not a test pattern is successful, and an operation of determining the optimum latch timing.

Figure 2:
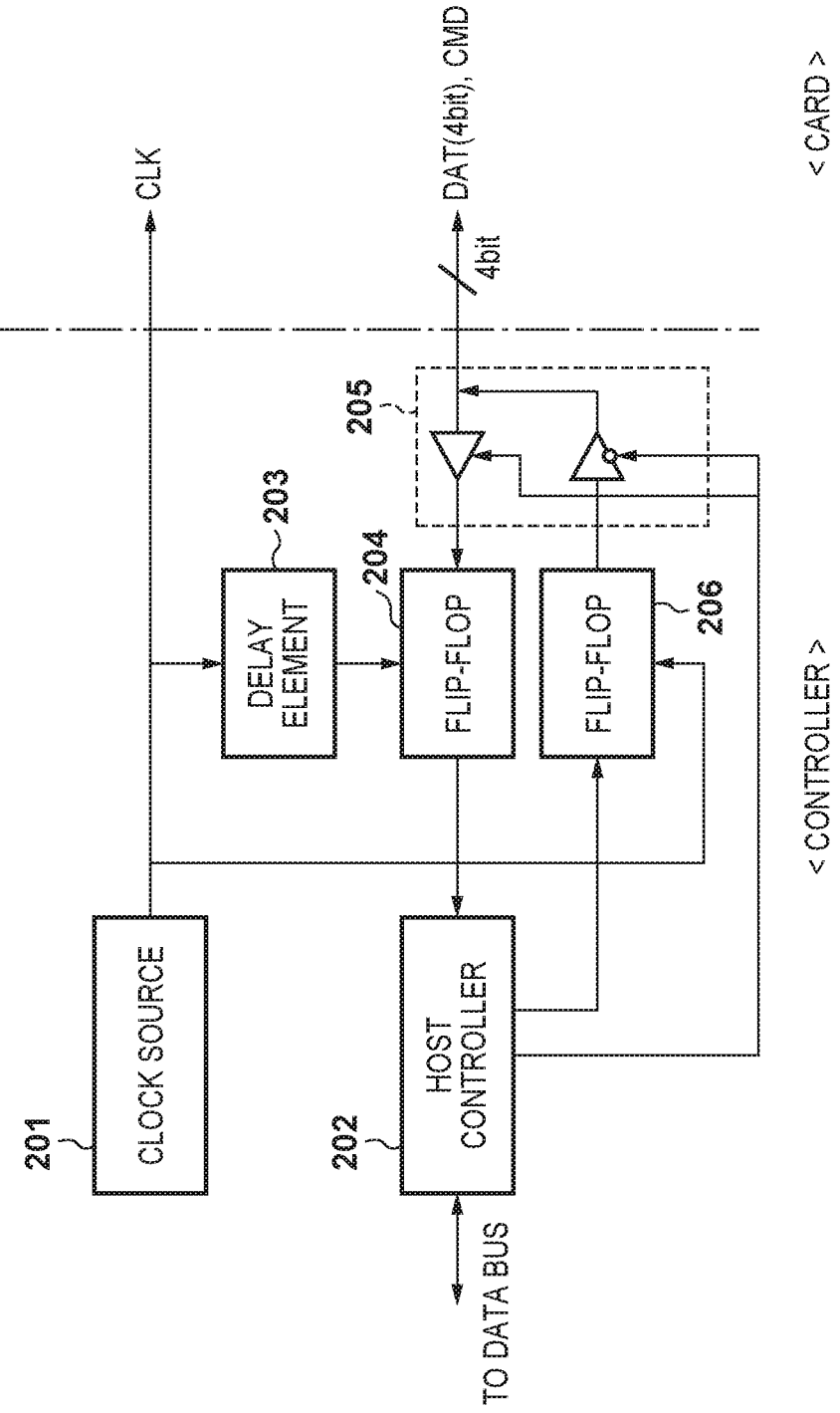
FIG. 2 is a block diagram showing detail of a memory card controller 113.

FIG. 2 is a block diagram showing the detail of the memory card controller 113. The memory card controller 113 performs transmission/reception of signals and data during writing and reading of data to and from the flash memory card 115 via a CLK line, a CMD line, and a DAT line. Specifically, a clock source 201 outputs clock signals (CLK signals) that are constituted by clock pulses and are used to control the timing of reading/writing to the flash memory card 115 via the CLK line.

The host controller 202 performs outputting of command signals related to reading/writing, and reception of response signals in response to the commands from the flash memory card 115, via the CMD line. Also, the host controller 202 performs control of transmitting/receiving data to be written to the flash memory card 115 or data read out from the flash memory card 115, via the DAT line. The host controller 202 transmits moving image data and still image data read from the buffer memory space in the DRAM 116, or other data, to the flash memory card 115 via the DAT line, in synchronization with clock signals from the clock source 201.

In reading and writing of data, as described above, the timing of the transmission/reception of the clock pulse is different from that of data. For this reason, a delay element 203 delays the phase of the clock signal according to control by the main microcomputer 118 when reading out data from the flash memory card 115, for example, and generates timing signals for latching data output from the flash memory card 115. Then, a flip-flop 204 latches data output from the flash memory card 115 according to the timing signals output from the delay element 203. That is to say, the timing signals define the timing of receiving data. Also, a flip-flop 206 latches data for writing from the host controller 202 according to the timing from the clock source 201. Note that switching between the CMD line and the DAT line according to input/output of commands and transmission/reception of data is performed by a signal branch unit 205. Responses and data from the flash memory card 115 that are output from the flip-flop 204 are sent to the host controller 202.

Next, a tuning operation of the present embodiment will be described with reference to FIGS. 1 and 2. The memory card controller 113 issues a test data transmission command to the flash memory card 115. In response to this, the flash memory card 115 transmits a data string (test data) of 64 bytes in a predetermined pattern in synchronization with a clock signal transmitted from the clock source 201. The memory card controller 113 receives the test data according to the timing signal that is obtained by delaying the clock signal generated from the clock source 201 by the delay element 203. Here, the phase of the timing signal can be changed by changing the value of the number of delay stages that is set in the delay element 203. The main microcomputer 118 judges whether or not the test data is successfully received, while changing the phase relationship between the clock signal and the timing signal, or in other words, while changing the latch timing of the flip-flop 204.

Specifically, the main microcomputer 118 transmits a command to transmit the test data to the flash memory card 115 in a state where the delay amount of the delay element 203 is set to a first delay amount. Then, the main microcomputer 118 uses the flip-flop 204 to receive the test data transmitted from the flash memory card 115 according to a timing signal with the first delay amount. The main microcomputer 118 compares the received test data to test data that is held in advance, and judges whether or not the test data was correctly received.

Upon completion of the reception processing of the test data according to the timing signal with the first delay amount, next, the main microcomputer 118 sets the delay amount of the delay element 203 to a second delay amount and causes the flash memory card 115 to send the command to transmit the test data again. Then, the main microcomputer 118 determines whether or not the test data received according to the timing signal with the second delay amount is correctly received.

In this way, the main microcomputer 118 repeats processing for determining whether or not the test data is correctly received at each delay amount, while changing the delay amount of the delay element 203. Note that the delay amount to be changed in one instance is about one several tenths of one cycle of a clock signal. Then, upon completion of the reception of the test data according to the timing signals with all the delay amounts, the main microcomputer 118 selects the delay amount with which the reception of the test data has succeeded the most stably, and sets this delay amount in the delay element 203 as the delay amount of the timing signal.

The series of processing described above is referred to as latch timing tuning processing (that is, processing for adjusting the delay amount of the timing signal). In this way, while tuning processing is performed, writing and reading of the image data to/from the flash memory card 115 cannot be performed.

Next, with reference to FIG. 3, processing will be described in which the digital camera 100 controls execution of tuning during pre-recording. Unless otherwise stated, processing in the steps in this flowchart is performed by the main microcomputer 118 executing operation programs stored in the ROM 119 to control the units of the digital camera 100.

Particularly, with reference to FIG. 3, an example of a moving image capturing mode for recording MPEG moving image data encoded using an MPEG encoding method accompanying inter-frame predictive encoding will be described. However, the present embodiment is not limited to inter-frame predictive encoding and MPEG encoding method, and can be applied to a case of recording any kind of moving image data is recorded. Furthermore, the data to be recorded is not limited to moving image data, and the present embodiment can be applied to a case where any data is continuously input to the buffer memory.

In addition to a normal recording mode, the digital camera 100 has a pre-recording mode in which pre-recording is activated. In the normal recording mode, when a recording start instruction is given by the user, the digital camera 100 starts encoding and recording of the moving image from the frame corresponding to the recording start instruction. Then, when a recording stop instruction is given, the digital camera 100 stops the recording of the moving image.

On the other hand, when pre-recording is activated, the digital camera 100 encodes a predetermined period's worth of moving image data, and records the encoded moving image data repeatedly to the buffer memory space in the DRAM 116 in the recording standby state. In the present embodiment, for example, the digital camera 100 encodes four second's worth of the moving image data in the recording standby state, and records the data sequentially in the buffer memory. Then, when the four second's worth of moving image data was recorded in the buffer memory, the digital camera 100 repeats processing for discarding the oldest part, in terms of time, of the moving image data, and recording new moving image data. When the recording start instruction is given by the user, the digital camera 100 reads out a predetermined period's worth (e.g., four second's worth) of the moving image data stored in the buffer memory before starting the recording, and records the data in the flash memory card 115. After that, the digital camera 100 continuously records the moving image data acquired after the recording start instruction to the flash memory card 115.

During recording, the main microcomputer 118 also needs to receive responses to write commands that have been output to the flash memory card 115, from the flash memory card 115. For this reason, even during recording, it is preferable that the memory card controller 113 receives the data transmitted from the flash memory card 115 at the proper latch timing. On the other hand, since images generated through moving image capturing are generally large in data size, if data writing is prevented by the tuning processing, the available capacity inside the buffer memory decreases, which may lead to stopping of recording due to buffer overflow. Since the available capacity in the buffer memory is small just after the start of recording, when tuning processing is performed just after the start of recording, the likelihood of buffer overflow will further increase. Accordingly, as will be described in detail later, the main microcomputer 118 reduces the likelihood that tuning processing will be needed just after the start of recording by executing the tuning processing at a predetermined timing during pre-recording.

Figure 3:
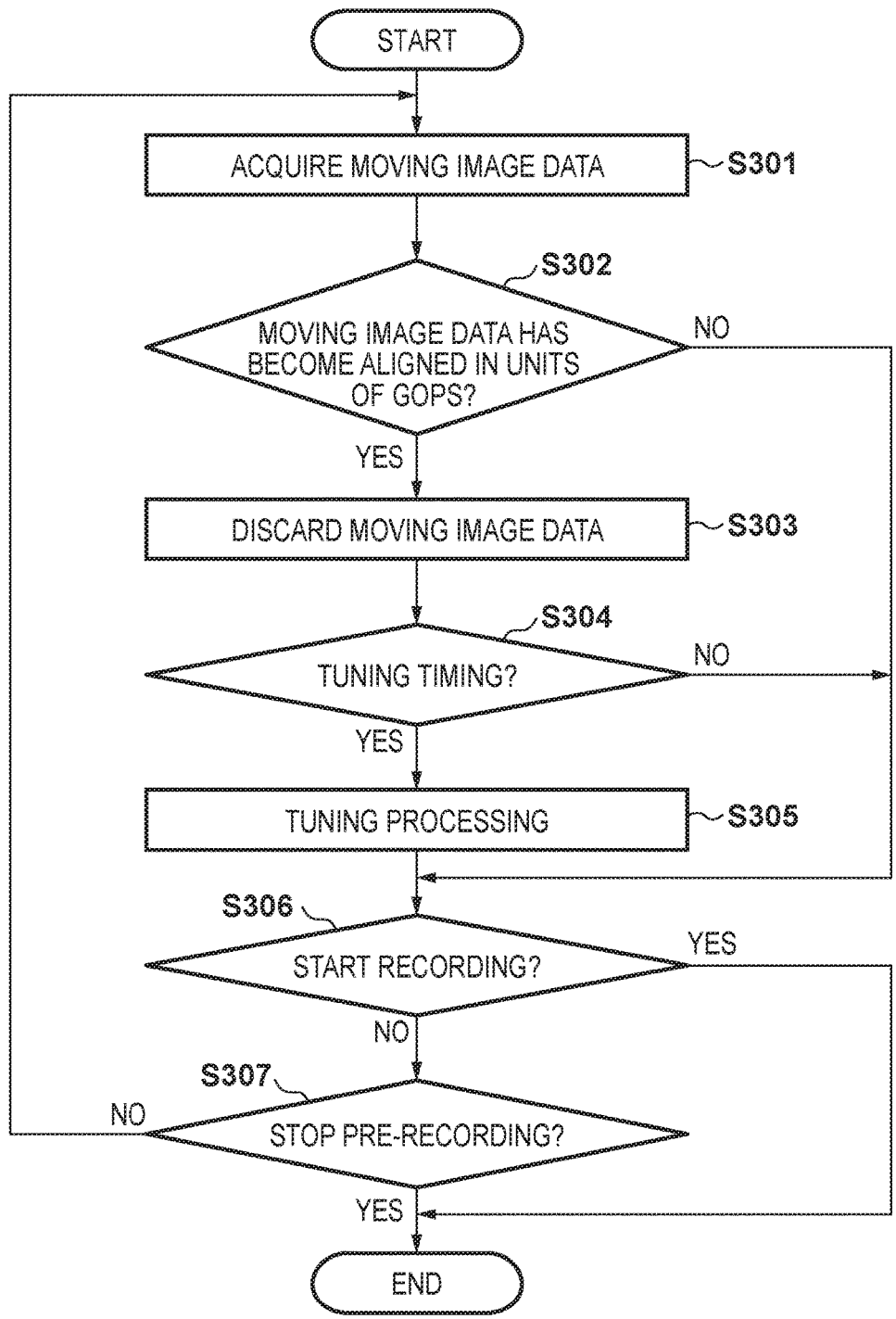
FIG. 3 is a flowchart of processing for controlling execution of tuning while the digital camera 100 is pre-recording.

In the recording standby state, when the user operates an operation key 117 to activate pre-recording (input start instruction for starting control of input to the buffer memory), the processing in the flowchart in FIG. 3 starts. In step S301, the main microcomputer 118 controls the MPEG encoding unit 109 so as to encode the moving image data, and accumulates (inputs) the encoded moving image data in the buffer memory in the DRAM 116 (moving image data buffer) allocated for moving image data.

In step S302, the main microcomputer 118 determines whether or not the moving image data accumulated in the moving image data buffer in the DRAM 116 has become aligned in units of GOPs. If the moving image data has become aligned in units of GOPs, the processing advances to step S303, and if not, the processing advances to step S306.

In step S303, the main microcomputer 118 discards the moving image data in the GOP that is the oldest in terms of time among the moving image data accumulated in the moving image data buffer in the DRAM 116. Note that the objective of partly discarding the moving image data in units of GOPs is to prevent the data amount held in the moving image data buffer from exceeding the threshold. Accordingly, the discarding here is not performed until the data amount held in the moving image data buffer reaches a predetermined amount (e.g., 90% of the buffer size).

In step S304, the main microcomputer 118 determines whether or not the timing for performing the tuning processing has come. In the present embodiment, the main microcomputer 118 executes tuning processing periodically during pre-recording (in the recording standby state). For example, the main microcomputer 118 executes tuning processing every predetermined period after pre-recording starts. If the timing for tuning processing has come, the processing advances to step S305, and if not, the processing advances to step S306.

In step S305, the main microcomputer 118 controls the memory card controller 113 so as to perform tuning processing of the flash memory card 115. In this way, the main microcomputer 118 performs tuning processing at a timing at which the moving image data buffer is comparatively available (a timing at which the moving image data has been partly discarded) during pre-recording (in the recording standby state).

Note that the frequency and timing of the tuning processing are not limited to the example shown in FIG. 3. The main microcomputer 118 need only perform tuning processing at least once at a predetermined timing during pre-recording. In addition, the units in which the main microcomputer 118 discards the moving image data is not limited to units of GOPs. For example, the main microcomputer 118 may discard the moving image data in units of frames or in units of seconds, and may discard the moving image data in other units.

In step S306, the main microcomputer 118 determines whether or not to start the recording of the moving image. For example, the main microcomputer 118 determines that moving image recording is to be started when the user operates the operation key 117 to give the recording start instruction. If moving image recording is not started, the processing advances to step S307. If moving image recording is started, the processing in this flowchart ends. In this case, the main microcomputer 118 controls the memory card controller 113 to read out the moving image data stored in the moving image data buffer sequentially starting from the oldest data in terms of time, and to record the read-out data to the flash memory card 115.

In step S307, the main microcomputer 118 determines whether or not to stop the pre-recording. For example, when the user operates the operation key 117 to give a pre-recording stop instruction, the main microcomputer 118 determines that the pre-recording is to be stopped. If pre-recording is not stopped, the proceeding returns to step S301, and if the pre-recording is stopped, the processing in this flowchart ends.

Figure 4:
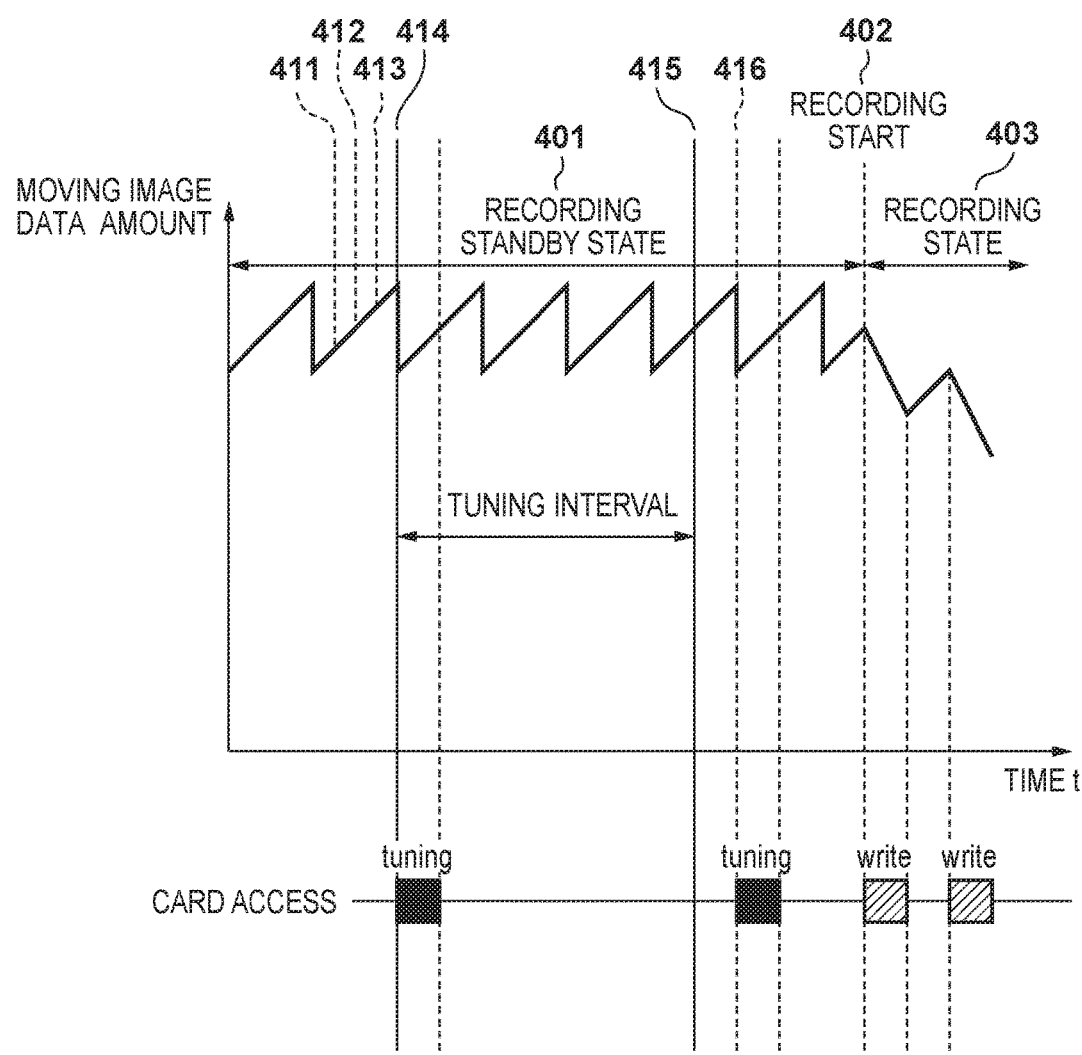
FIG. 4 is a diagram for describing a series of operations in the flowchart in FIG. 3.

FIG. 4 is a diagram showing a series of operations in the flowchart in FIG. 3 in chronological order, using transitions in the accumulation state in the moving image data buffer in the recording standby state and the recording state, and the period for write processing and tuning processing. In FIG. 4, the vertical axis indicates the amount of moving image data accumulated in the moving image data buffer, and the horizontal axis indicates time "t". Note that the moving image data buffer is allocated to the DRAM 116.

In the present embodiment, the data writing speed to the flash memory card 115 is higher than the data rate of the encoded moving image data. Thus, when recording moving image data, the main microcomputer 118 temporarily stores the encoded moving image data in the buffer memory space in the DRAM 116. Then, when the data amount of the moving image data that is stored in the buffer memory and is yet to be recorded reaches a predetermined data amount, the main microcomputer 118 reads out the moving image data from the buffer memory and stores it in the flash memory card 115. Since the recording speed of the flash memory card 115 is higher than the data rate of the moving image data, the data amount of the moving image data stored in the buffer memory decreases while the moving image data is being written to the flash memory card 115. Then, when writing of the moving image data of a predetermined size to the flash memory card 115 is completed, the writing is stopped. In this way, in the present embodiment, in the period from when the recording of the moving image starts to when it stops, the recording control is performed such that the moving image data is intermittently (repeatedly) recorded in the flash memory card 115. Also, when pre-recording is activated, the main microcomputer 118 performs writing processing to the flash memory card 115 continuously after the start of recording until the moving image data stored in the moving image data buffer reaches a size that is less than or equal to the size of one instance of writing.

In FIG. 4, the reference sign 401 indicates a period of the recording standby state. The reference sign 402 indicates timing of starting recording. The reference sign 403 indicates a period of the recording state. The main microcomputer 118 acquires the moving image data and accumulates the data in the moving image data buffer at the timings indicated by reference signs 411, 412, and 413, respectively.

The main microcomputer 118 acquires the moving image data and accumulates the data in the moving image data buffer at the timing indicated by reference sign 414. Also, at this timing, the main microcomputer 118 determines that the moving image data has become aligned in units of GOPs, and discards the moving image data of the oldest GOP at this time. Furthermore, the main microcomputer 118 determines that the timing for tuning processing has come, and performs tuning processing.

A period between the timing indicated by reference sign 414 and the timing indicated by reference sign 415 is a tuning interval (a period that is not a timing for tuning processing). Accordingly, in this period, the main microcomputer 118 performs the discarding of the moving image data periodically, but does not perform tuning processing.

The main microcomputer 118 acquires the moving image data at the timing indicated by the reference sign 416 and accumulates the data in the moving image data buffer. Also, at this timing, the main microcomputer 118 determines that the moving image data has become aligned in units of GOPs, and discards the moving image data of the oldest GOP at this time. Furthermore, at this timing, since the timing 415 has passed at which a predetermined amount of time has elapsed since the timing 414 of the previous tuning processing, the main microcomputer 118 determines that the timing for tuning processing has come. Accordingly, the main microcomputer 118 performs tuning processing.

When pre-recording is activated, in the recording standby state, the main microcomputer 118 accumulates the moving image data with a data amount that is close to the upper limit of the capacity of the moving image data buffer in order to use the capacity of the moving image data buffer efficiently. Therefore, if a writing error or the like occurs just after the start of recording due to lack of tuning and the moving image data no longer can be written, the moving image data buffer overflows. In view of this, when pre-recording is activated, the main microcomputer 118 performs tuning processing at the timings indicated by reference signs 414 and 416 in the recording standby state. Since the data is not written to the flash memory card 115 in the recording standby state, the writing of the moving image data to the flash memory card 115 will not be hindered even if tuning processing is performed. Also, at the timings indicated by the reference signs 414 and 416, due to the moving image data being partly discarded, there is comparatively more leeway in the available capacity of the moving image data buffer. Accordingly, even when the recording start instruction is given just after executing tuning processing, it is possible to suppress an increase in the likelihood that buffer overflow will occur.

As described above, according to the first embodiment, the digital camera 100 executes tuning processing at the predetermined timing during execution of pre-recording (e.g., the timing at which the partial discarding of moving image data is executed). In this way, the likelihood that a writing error and the like will occur in the period just after the start of recording when the available capacity of the buffer memory is small is reduced, and thus the likelihood that buffer overflow will occur after the start of recording is reduced.

Second Embodiment

In the first embodiment, tuning processing during pre-recording was described. In a second embodiment, tuning processing performed after the start of recording will be described. In the present embodiment, the basic configuration of the digital camera 100 and the memory card controller 113 is similar to that of the first embodiment (see FIGS. 1 and 2). Hereinafter, the difference from the first embodiment will mainly be described.

Just after the start of recording, the available capacity of the moving image data buffer is still small until the moving image data has been repeatedly written to the flash memory card 115. In view of this, in the second embodiment, the digital camera 100 performs tuning processing, avoiding a period just after the recording standby state transitions to the recording state, in which the usage rate of the moving image data buffer is high.

Figure 5:
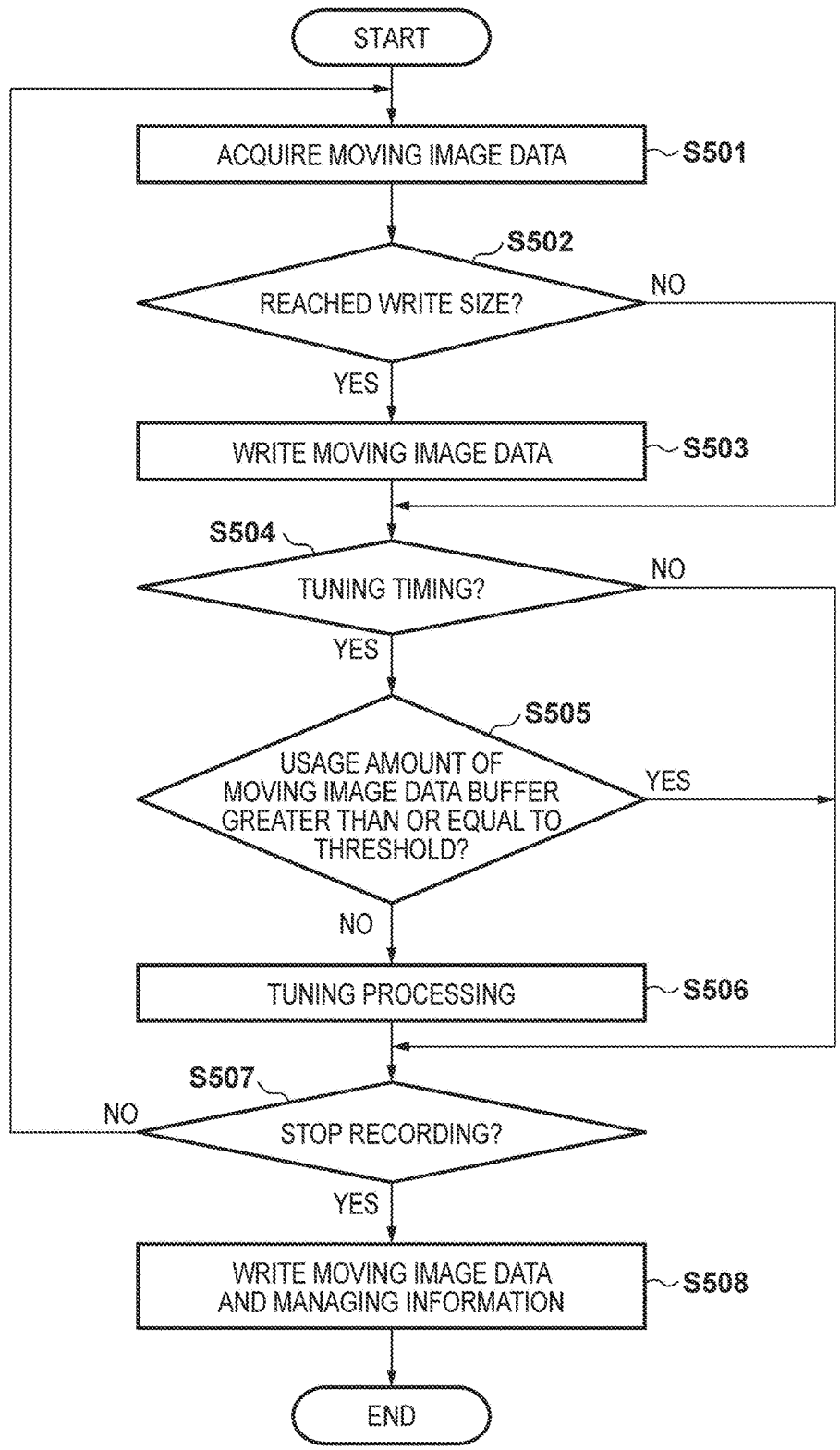
FIG. 5 is a flowchart of processing for controlling execution of tuning while the digital camera 100 is recording the moving image data.

With reference to FIG. 5, processing will be described in which the digital camera 100 controls execution of tuning while the moving image data is recorded. Unless otherwise stated, processing in the steps in this flowchart is performed by the main microcomputer 118 executing operation programs stored in the ROM 119 to control the units of the digital camera 100. In step S306 in FIG. 3, if the main microcomputer 118 determines that recording the moving image is to be started, the processing in the flowchart in FIG. 5 starts.

In step S501, continuing from the recording standby state, the main microcomputer 118 controls the MPEG encoding unit 109 so as to encode the moving image data and accumulates the encoded moving image data in a moving image data buffer in the DRAM 116 allocated for moving image data.

In step S502, the main microcomputer 118 determines whether or not the total size of the moving image data accumulated in the moving image data buffer in the DRAM 116 has reached a write size. Here, the write size is the size of moving image data to be written to the flash memory card 115 in response to one write command. If the total size of the moving image data accumulated in the moving image data buffer has reached the write size, the processing advances to step S503, and if not, the processing advances to step S504.

In step S503, the main microcomputer 118 controls the memory card controller 113 to issue a write command to the flash memory card 115. Then, the main microcomputer 118 writes, to the flash memory card 115, the moving image data accumulated in the moving image data buffer in the DRAM 116. As described above, just after a transition is made from the recording standby state to the recording state, moving image data with a data amount close to the upper limit of the capacity is accumulated in the moving image data buffer. For this reason, until multiple instances of writing have been executed and the total size of the moving image data accumulated in the moving image data buffer becomes less than the write size, it is determined that the size of the moving image data accumulated in the moving image data buffer has reached the write size, and writing is performed continuously.

In step S504, the main microcomputer 118 determines whether or not the timing of performing tuning processing has come. In this embodiment, after the start of recording, continuing from the timing of the previous tuning in the recording standby state, the timing of tuning processing arrives every time a predetermined period has elapsed. If the timing for tuning processing has come, the processing advances to step S505, and if not, the processing advances to step S507.

In step S505, the main microcomputer 118 determines whether or not the usage amount of the moving image data buffer, that is, the data amount of the moving image data that is yet to be recorded and is accumulated in the moving image data buffer, is greater than or equal to the threshold α (MB). If the usage amount of the moving image data buffer is not greater than or equal to the threshold, the processing advances to step S506, and if the usage amount is more than or equal to the threshold, the processing advances to step S507.

In step S506, the main microcomputer 118 controls the memory card controller 113 to perform tuning processing.

In step S507, the main microcomputer 118 determines whether or not to stop the recording of the moving image. For example, if the data capacity in the flash memory card 115 becomes full, or if an instruction to stop the recording is given via the operation key 117, it is determined that the recording of the moving image is to be stopped. If the recording of the moving image is not stopped, the processing returns to step S501, and the main microcomputer 118 continues the recording of the moving image. If the recording of the moving image is stopped, the processing advances to step S508.

In step S508, in order to close the file, the main microcomputer 118 writes, to the flash memory card 115, the moving image data and the managing information that have been accumulated in the moving image data buffer in the DRAM 116.

Figure 6:
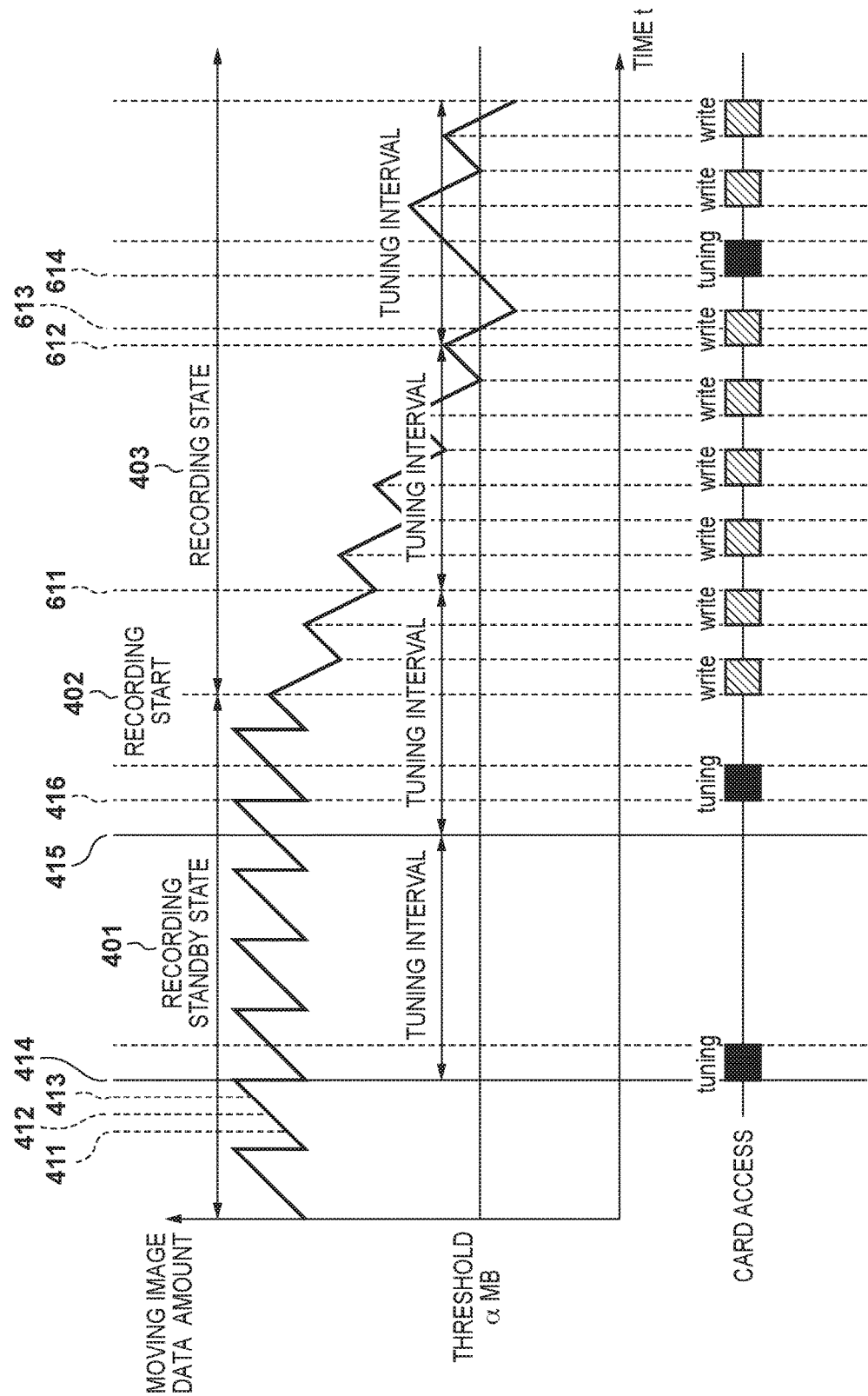
FIG. 6 is a diagram for describing a series of operations in the flowcharts in FIGS. 3 and 5.

FIG. 6 is a diagram showing a series of operations in the flowchart in FIG. 5 in chronological order, using the transitions of the accumulation state in the moving image data buffer during the recording of the moving image, and the time for write processing and tuning processing. In FIG. 6, the vertical axis indicates the amount of moving image data accumulated in the moving image data buffer, and the horizontal axis indicates time "t". Note that the moving image data buffer is allocated to the DRAM 116. In addition, in FIG. 6, the reference signs that are the same as those in FIG. 4 indicate the same or similar periods, timings, and the like of FIG. 4.

The processing in the recording standby state is similar to that in the first embodiment. At the timing 402 when the recording start instruction is given, since the moving image data stored in the moving image data buffer has reached the write size, the main microcomputer 118 controls the memory card controller 113 to start recording from the oldest moving image data.

At the timings indicated by reference signs 611 and 612, the main microcomputer 118 determines that the timing for tuning processing has come. However, since the usage amount of the moving image data buffer is more than or equal to the threshold α at these timings, the main microcomputer 118 does not perform tuning processing. Thereafter, at the timing indicated by reference sign 613, the usage amount of the moving image data buffer becomes less than the threshold a. Therefore, the main microcomputer 118 performs control for starting tuning processing, and tuning processing starts at the timing indicated by reference sign 614.

As described above, according to the second embodiment, the digital camera 100 does not perform tuning processing if the data amount held in the buffer memory that is yet to be recorded is greater than or equal to the threshold during recording the moving image data to the flash memory card 115. Therefore, the digital camera 100 performs tuning processing, avoiding the period just after a transition is made from the pre-recording state to the recording state, in which the usage rate of the buffer memory is high. In this way, the likelihood that buffer overflow will occur during recording the moving image data is reduced.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-059692, filed Mar. 24, 2017, which is hereby incorporated by reference herein in its entirety.

What is claimed is:

1. A recording apparatus comprising:
   an output unit configured to output a clock signal to a storage medium;
   an input/output unit configured to output a write command and data to be written to the storage medium according to the clock signal in order to write data to the storage medium, and configured to receive data from the storage medium according to a timing signal;
   a generation unit configured to generate the timing signal by delaying the clock signal;
   an adjustment unit configured to execute adjustment processing for adjusting a delay amount of the timing signal;
   a buffer memory configured to hold input data;
   an input control unit configured to execute input control to input continuously recording target data to be recorded to the storage medium, to the buffer memory;
   a recording control unit configured to execute recording control for recording the recording target data held in the buffer memory to the storage medium, using the input/output unit; and
   a control unit configured to control the input control unit, the recording control unit, and the adjustment unit,
   wherein the control unit:
      performs control such that the input control is started before a recording start instruction and the recording control is started in response to the recording start instruction; and
      performs control such that the adjustment processing is executed during execution of the input control and before the recording control is started in response to the recording start instruction.

2. The recording apparatus according to claim 1, comprising
   a discarding unit configured to partly discard the recording target data held in the buffer memory such that a data amount of the recording target data held in the buffer memory does not exceed a first threshold while the input control is being executed before the recording start instruction is received.

3. The recording apparatus according to claim 2, wherein the control unit performs control such that the adjustment processing is executed at a timing when the recording target data is partly discarded by the discarding unit.

4. The recording apparatus according to claim 2, wherein the discarding unit performs discarding in units of GOPs, units of frames, or units of seconds.

5. The recording apparatus according to claim 1, wherein the control unit performs control such that the adjustment processing is executed periodically during execution of the input control and before the recording control is started in response to the recording start instruction.

6. The recording apparatus according to claim 1, wherein the control unit performs control such that both the input control and the recording control are performed after the recording start instruction is received.

7. The recording apparatus according to claim 1, wherein the control unit performs control such that the recording control is executed after the recording start instruction is received and until a recording stop instruction is received.

8. The recording apparatus according to claim 1, comprising
   a discarding unit configured to discard the recording target data recorded in the storage medium from the buffer memory after the recording start instruction is received,
   wherein the control unit performs control such that the adjustment processing is not executed if a data amount of the recording target data held in the buffer memory is greater than or equal to a second threshold after the recording start instruction is received.

9. The recording apparatus according to claim 1, comprising
   a receiving unit configured to receive the recording start instruction from a user.

10. The recording apparatus according to claim 1, further comprising
    an image capturing unit,
    wherein the input control unit continuously inputs moving image data captured by the image capturing unit to the buffer memory, as the recording target data.

11. A control method executed by a recording apparatus comprising:
    an output unit configured to output a clock signal to a storage medium;
    an input/output unit configured to output a write command and data to be written to the storage medium according to the clock signal in order to write data to the storage medium, and configured to receive data from the storage medium according to a timing signal;
    a generation unit configured to generate the timing signal by delaying the clock signal; and
    a buffer memory configured to hold input data, the control method comprising:
    executing adjustment processing for adjusting a delay amount of the timing signal;
    executing input control to input continuously recording target data to be recorded to the storage medium, to the buffer memory;
    executing recording control for recording the recording target data held in the buffer memory to the storage medium, using the input/output unit;
    performing control such that the input control is started before a recording start instruction and the recording control is started in response to the recording start instruction; and
    performing control such that the adjustment processing is executed during execution of the input control and before the recording control is started in response to the recording start instruction.

12. A non-transitory computer-readable storage medium which stores a program for causing a computer of a recording apparatus to execute a control method, the recording apparatus comprising:
    an output unit configured to output a clock signal to a storage medium;
    an input/output unit configured to output a write command and data to be written to the storage medium according to the clock signal in order to write data to the storage medium, and configured to receive data from the storage medium according to a timing signal;
    a generation unit configured to generate the timing signal by delaying the clock signal; and
    a buffer memory configured to hold input data, the control method comprising:
    executing adjustment processing for adjusting a delay amount of the timing signal;

executing input control to input continuously recording target data to be recorded to the storage medium, to the buffer memory;

executing recording control for recording the recording target data held in the buffer memory to the storage medium, using the input/output unit;

performing control such that the input control is started before a recording start instruction and the recording control is started in response to the recording start instruction; and performing control such that the adjustment processing is executed during execution of the input control and before the recording control is started in response to the recording start instruction.

* * * * *